United States Patent [19]

Saitoh

[11] Patent Number: 4,900,949
[45] Date of Patent: Feb. 13, 1990

[54] DELAY TYPE FLIP-FLOP ARRANGEMENT USING TRANSISTOR TRANSISTOR LOGIC

[75] Inventor: Hitoshi Saitoh, Kawasaki, Japan

[73] Assignee: Fujitsu Limited, Kawasaki, Japan

[21] Appl. No.: 238,063

[22] Filed: Aug. 30, 1988

[30] Foreign Application Priority Data

Aug. 31, 1987 [JP] Japan .................................. 62-215100

[51] Int. Cl.$^4$ .................. H03K 3/284; H03K 19/088; H03K 19/084
[52] U.S. Cl. .............................. 307/272.2; 307/456; 307/458; 307/530
[58] Field of Search .................... 307/530, 272 R, 443, 307/456, 458, 270

[56] References Cited

U.S. PATENT DOCUMENTS 4,626,706 12/1986 Allen et al. ...................... 307/272.2

Primary Examiner—Andrew J. James
Assistant Examiner—Margaret Rose Wambach
Attorney, Agent, or Firm—Armstrong, Nikaido, Marmelstein, Kubovcik

[57] ABSTRACT

A flip-flop arrangement receiving a clock signal and an input data and outputting a logical output in accordance with a logical level of the data. The arrangement includes a master flip-flop for transmitting a change in the logical level of the data to a pair of output ends when the clock signal is at a predetermined logical level; a slave flip-flop for latching the data transmitted via the pair of output ends; an output buffer for effecting a buffering of the data latched in the slave flip-flop; and a drive circuit for driving the output buffer. The drive circuit responds to logical levels of data appearing at the pair of output ends of the master flip-flop and, based on the logical levels, drives the output buffer to determine a logical output to be output from the arrangement, thereby reducing a total propagation delay time and realizing a high speed operation without increasing a power dissipation.

1 Claim, 5 Drawing Sheets

Fig. 2a CLOCK CP
Fig. 2b OUTPUT $\overline{CP}$ OF INVERTER
Fig. 2c DATA D
Fig. 2d OUTPUT Q1 OF MASTER F.F.
Fig. 2e OUTPUT $\overline{Q1}$ OF MASTER F.F.
Fig. 2f OUTPUT Q2 OF SLAVE F.F.
Fig. 2g OUTPUT Q OF OUT. BUFFER

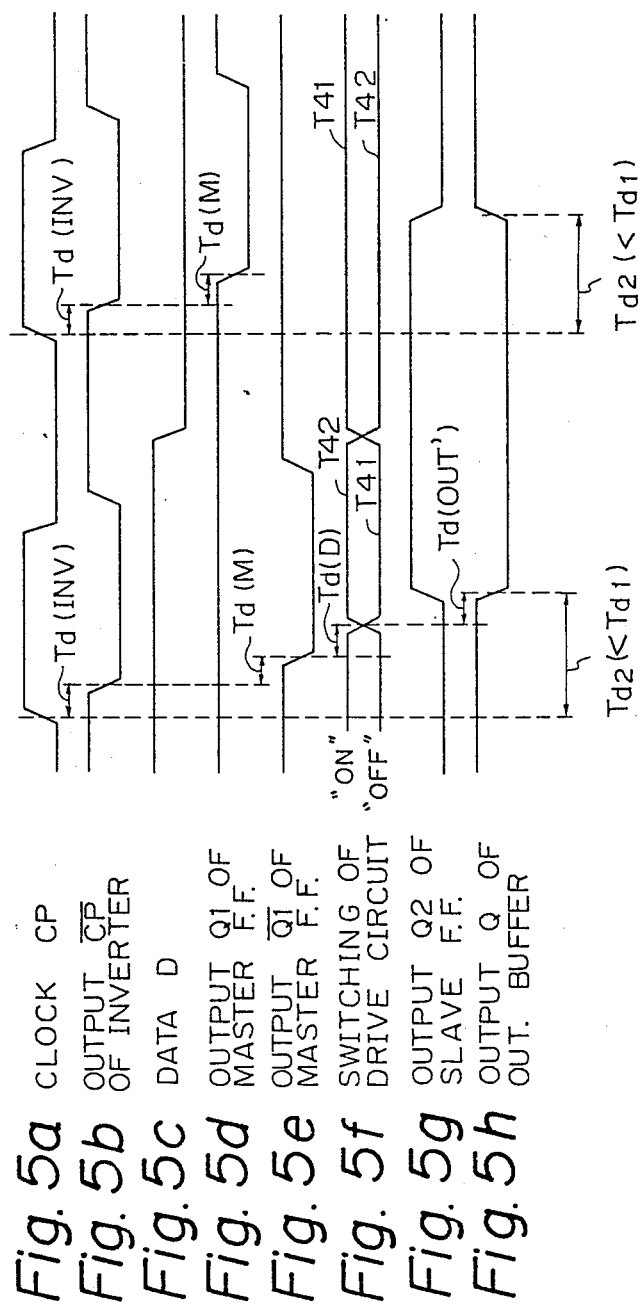

DELAY TYPE FLIP-FLOP ARRANGEMENT USING TRANSISTOR TRANSISTOR LOGIC

BACKGROUND OF THE INVENTION

1. Field of the Invention

The present invention relates to a flip-flop arrangement and, more particularly, to a delay type flip-flop (D-F.F.) arrangement using a transistor transistor logic (TTL). The D-F.F. arrangement according to the present invention can be utilized, for example, as an output flip-flop in a programmable read only memory additionally having a function of an output register.

2. Description of the Related Art

A known typical D-F.F. arrangement includes an input buffer, a master F.F. responding to a clock signal fed via the input buffer and an input data, a slave F.F. responding to an output of the master F.F., and an output buffer responding to an output of the slave F.F. According to the arrangement, the master F.F. carries out its flip-flop operation when the clock signal is at a predetermined logical level and transmits a change in the input data to the slave F.F., where the data is latched. The output buffer effects a buffering of the data latched in the slave F.F. and outputs the buffered data as a logical output of the arrangement.

That is to say, each of three gates from the master F.F. through the output buffer is activated by the output of the preceding gate. Therefore, the total propagation delay time required from when the clock signal is changed in logical level until when the logical output is settled in logical level is indicated by the sum of propagation delay time in each of four gates. In this case, it would be preferable to improve a circuit constitution and to reduce the total propagation delay time as short as possible.

On the other hand, in order to increase the operation speed in the D-F.F. arrangement, it is considered to decrease a resistance in each gate and, accordingly, to increase the amount of currents flowing therein. However, the increase in currents leads to the increase in the power dissipation, which is not preferable.

SUMMARY OF THE INVENTION

An object of the present invention is to provide a flip-flop arrangement which can reduce a propagation delay time to realize a high speed operation thereof without increasing a power dissipation.

The above object is attained by providing a flip-flop arrangement receiving a clock signal and an input data and outputting a logical output in accordance with a logical level of the data, the flip-flop arrangement including: a master flip-flop for transmitting a change in the logical level of the data to a pair of output ends when the clock signal is at a predetermined logical level; a slave flip-flop, operatively connected to the master flip-flop, for latching the data transmitted via the pair of output ends; an output buffer, operatively connected to the slave flip-flop, for effecting a buffering of the data latched in the slave flip-flop; and a drive circuit, operatively connected between the master flip-flop and the output buffer, for driving the output buffer to output the logical output in response to logical levels of data appearing at the pair of output ends of the master flip-flop.

BRIEF DESCRIPTION OF THE DRAWINGS

Other objects and features of the present invention will be described hereinafter in detail by way of preferred embodiments with reference to the accompanying drawings, in which:

FIGS. 5a to 5h are waveform diagrams for explaining an operation of the circuit shown in FIG. 4.

DESCRIPTION OF THE PREFERRED EMBODIMENTS

For a better understanding of the preferred embodiment, the problem in the prior art will now be explained with reference to FIGS. 1 and 2a to 2g.

Figure 1:
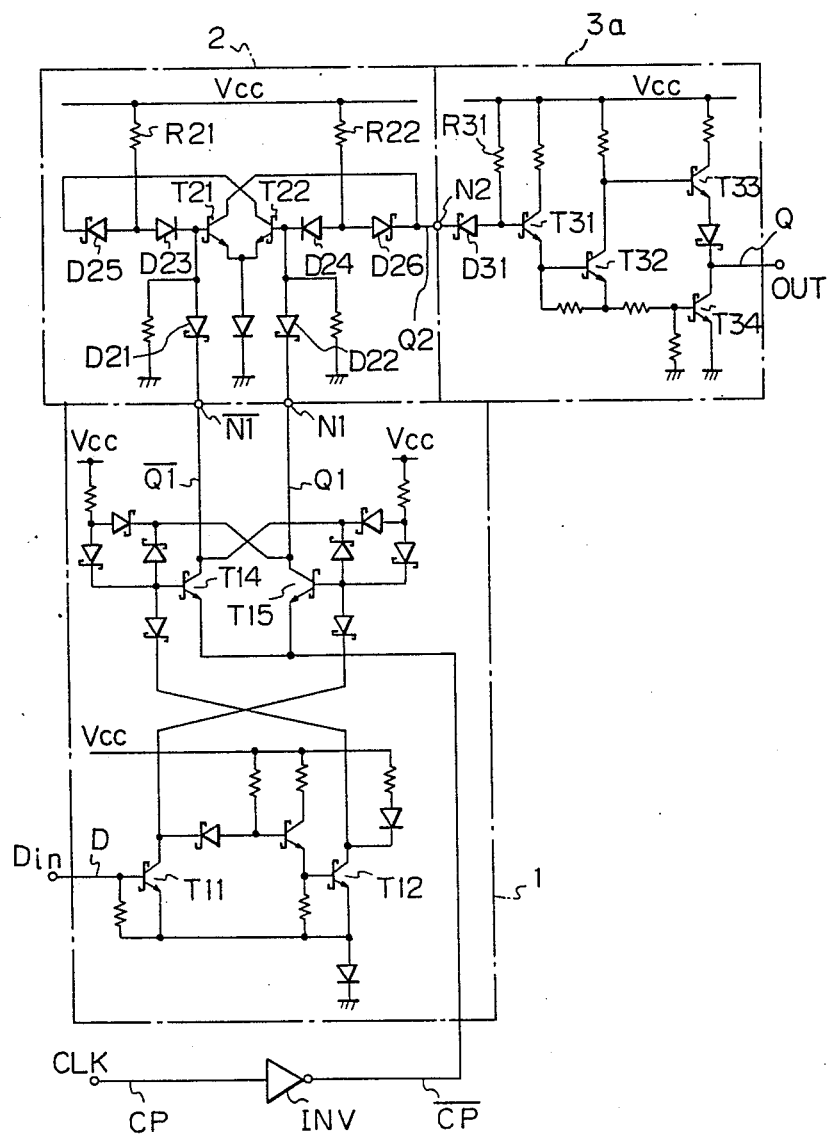
FIG. 1 is a circuit diagram illustrating a typical example of a prior art D-F.F. arrangement.

FIG. 1 shows a circuit constitution of a typical example of a prior art D-F.F. arrangement, and FIGS. 2a to 2g show waveforms representing an operation thereof. The D-F.F. arrangement of FIG. 1 is constituted by an inverter INV as an input buffer, a master F.F. 1, a slave F.F. 2 and an output buffer 3a.

Initially, assuming that an input data D of "H" level is applied to an input terminal Din. In this state, when a clock CP is at "L" level, both of emitters of transistors T14 and T15 are brought to "H" level via the inverter INV. Thus, since the transistors T14 and T15 keep their OFF states, the master F.F. 1 cannot carry out its flip-flop operation. Accordingly, outputs Q1 and $\overline{Q1}$ of the master F.F.1 are maintained at "H" level (see FIGS. 2d and 2e).

Figure 2:
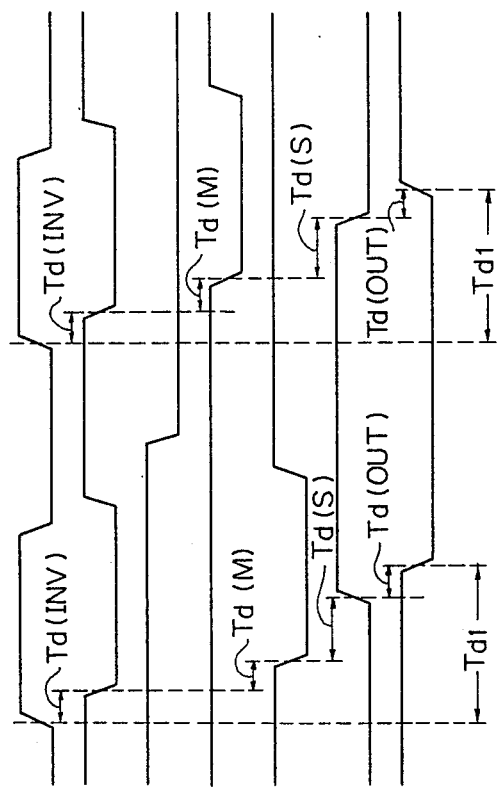
FIGS. 2a to 2g are waveform diagrams for explaining an operation of the circuit shown in FIG. 1.

When the clock CP is changed to "H" level, the emitters of the transistors T14 and T15 are brought to "L" level. Accordingly, in this state, the master F.F. 1 can carry out its flip-flop operation in accordance with potentials appearing at bases of the transistors T14 and T15, i.e., the input logical level of the data D. However, the operation of the inverter INV is normally accompanied with a propagation delay. As is shown in FIGS. 2a and 2b, when the clock CP is changed from "L" level to "H" level, the output $\overline{CP}$ of the inverter INV, i.e., the potential at the emitters of the transistors T14 and T15, is changed from "H" level to "L" level with a certain constant delay. The propagation delay time required from when the clock CP is changed in level until when the output $\overline{CP}$ of the inverter INV is settled to the definite level will be hereinafter indicated by reference $T_d$ (INV).

On the other hand, the transistors T14 and T15 start carrying out the flip-flop operation at a time when the output $\overline{CP}$ of the inverter INV is changed to "L" level. In this case, since the input data D is at "H" level, a transistor T11 is turned ON and a transistor T12 is turned OFF. Accordingly, the potential at the base of the transistor T15 is lowered and that of the transistor T14 is raised by currents fed from a power supply line Vcc. As a result, the transistor T14 is turned ON and, accordingly, the output Q1 of the master F.F. is lowered to "L" level. Inversely, where the data D is at "L" level, the transistor T15 is turned ON and, accordingly, the output $\overline{Q1}$ is lowered to "L" level. Namely, the state of the data D or the change therein is transmitted to the node N1 or $\overline{\text{N1}}$ in response to the change of "H" to "L" level of the output $\overline{\text{CP}}$ of the inverter. In this case as well, as shown in FIGS. 2b to 2e, when the signal $\overline{\text{CP}}$ is changed from "H" level to "L" levels, the outputs Q1 and $\overline{\text{Q1}}$ appearing at the nodes N1 and $\overline{\text{N1}}$ are settled to their definite logical levels in accordance with the logical level of the data D with a certain constant delay. The propagation delay time required from when the output $\overline{\text{CP}}$ is changed to "L" level until when the outputs Q1 and $\overline{\text{Q1}}$ of the master F.F. are settled to logical levels corresponding to the logical level of the data D will be hereinafter indicated by reference Td(M).

The slave F.F. 2 includes a pair of transistors T21 and T22 interconnected to each other to carry out a complementary operation. The transistors T21 and T22 carry out the flip-flop operation in accordance with the levels of voltages applied to their bases, i.e., the levels of voltages appearing at the nodes N1 and $\overline{\text{N1}}$, respectively. For example, when the node N1, is at "L" level, a potential at the base of the transistor T21 is lowered, resulting in the OFF state of the transistor T21. Accordingly, a potential at the collector of the transistor T21, i.e., a potential at the output end N2 of the slave F.F. 2, is brought to "H" level. Inversely, when the node N1 is at "H" level, the transistor T21 is turned ON, so that the output Q2 appearing at the node N2 is brought to "L" level. In this case as well, as shown in FIGS. 2d to 2f, when the output Q1 ($\overline{\text{Q1}}$) appearing at the node N1 ($\overline{\text{N1}}$), is changed in level, the output Q2 appearing at the node N2 is settled to its definite logical level with a certain constant delay. The propagation delay time required from when the output Q1, ($\overline{\text{Q1}}$) is changed in level until when the output Q2 is settled in level will be hereinafter indicated by reference $T_d$ (S).

The output buffer 3a carries out its buffering operation in accordance with the level of the output Q2 appearing at the node N2 and outputs the buffered signal to its output end OUT as the output Q. For example, when the output Q2 is at "H" level, a transistor T31 is turned ON, so that a transistor T32 is turned ON and a transistor T34 is then turned ON. As a result, the output Q is brought to "L" level. Inversely, when the output Q2 is at "L" level, a transistor T33 is turned ON, so that the output Q is brought to "H" level. Namely, the output buffer 3a functions as an inverter. In this case as well, as shown in FIGS. 2f and 2g, when the output Q2 at the node N2 is changed in level, the output Q at the output end OUT is settled to its definite logical level with a certain constant delay. The propagation delay time required from when the output Q2 is changed in level until when the output Q is settled in level will be hereinafter indicated by reference $T_d$ (OUT).

Therefore, the total propagation delay time $T_{d1}$ required from when the clock CP is changed from "L" level to "H" level until when the output Q is settled to logical level corresponding to the logical level of the data D is indicated as follows:

$$T_{d1} = T_d(\text{INV}) + T_d(\text{M}) + T_d(\text{S}) + T_d(\text{OUT})$$

In order to increase the operation speed in the D-F.F. arrangement shown in FIG. 1, it is necessary to take measures to decrease a resistance in each of four gates INV, 1, 2 and 32a, for example, to decrease values of resistors R21 and R22 employed in the slave F.F. 2. However, since the currents flowing in each of the gates are increased in quantity due to the decrease in the resistance, the power dissipation is accordingly increased. Therefore, the measures to decrease the resistance are not preferable.

On the other hand, the portion at which the greatest propagation delay occurs among the four gates is the portion at which data is transmitted from the slave F.F. 2 to the output buffer 3a. The reason is that, in the slave F.F. 2, the transistor T21 (T22) is supplied with its base current from the power supply line $V_{CC}$ via the resistor R21 (R22), and its ON/OFF operation depends upon the value of the resistor and is normally time-consuming. The propagation delay time Td (S) in the slave gate 2 occupies a good few of percentages among the total propagation delay time $T_{d1}$, although it depends upon a value of each element in the circuit, a condition for the design of the circuit, or the like. According to the simulation of the circuit illustrated in FIG. 1, the delay time $T_d$ (S) occupies approximately one third of the total delay time $T_{d1}$. Thus, it would be preferable to reduce the propagation delay time $T_d$ (S) in the slave gate as short as possible, or to realize the state in which the delay time $T_d$ (S) can be substantially disregarded.

Figure 3:
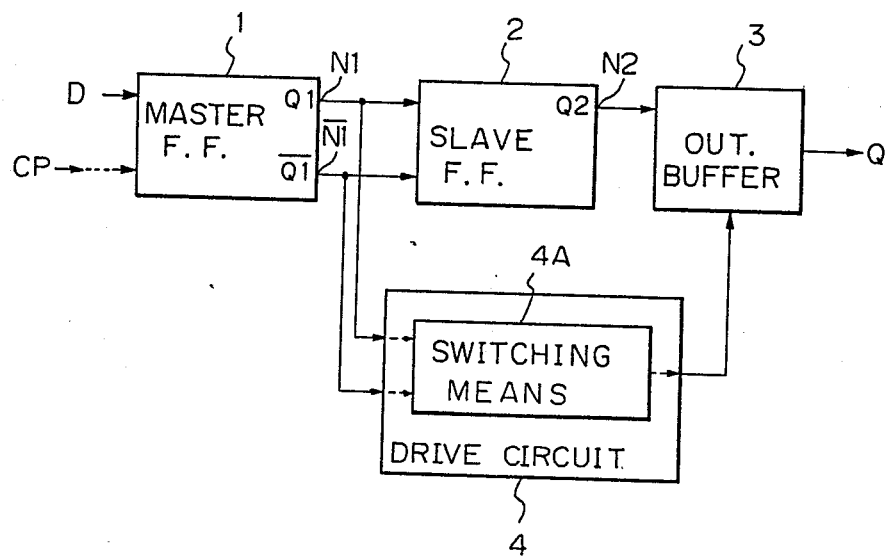
FIG. 3 is a block diagram illustrating a constitution of the flip-flop arrangement according to the present invention.

FIG. 3 illustrates a constitution of the flip-flop arrangement according to the present invention.

In FIG. 3, reference 1 denotes a master F.F., which responds to an input data D and a clock signal CP (preferably, a clock signal $\overline{\text{CP}}$ fed through an input buffer) and carries out its flip-flop operation. The master F.F. 1 has a function of transmitting a state or change in the data D to a pair of output ends N1 and $\overline{\text{N1}}$ when the clock signal CP ($\overline{\text{CP}}$) is at a predetermined logical level. Reference 2 denotes a slave F.F., which latches the data Q1 and $\overline{\text{Q1}}$ transmitted from the master F.F. 1. Reference 3 denotes an output buffer, which effects a buffering of the data latched in the slave F.F. 2.

Reference 4 denotes a drive circuit, which responds to logical levels of data Q1 and $\overline{\text{Q1}}$ appearing at the output ends N1 and $\overline{\text{N1}}$ of the master F.F. 1 and drives the output buffer 3 to output a logical output Q. The drive circuit 4 includes a switching means 4A, which is constituted by at least one transistor in the present example and enable to be turned ON or OFF in response to the logical levels of the data Q1 and $\overline{\text{Q1}}$, thereby determining the logical output Q to be output via the output buffer 3.

Figure 4:
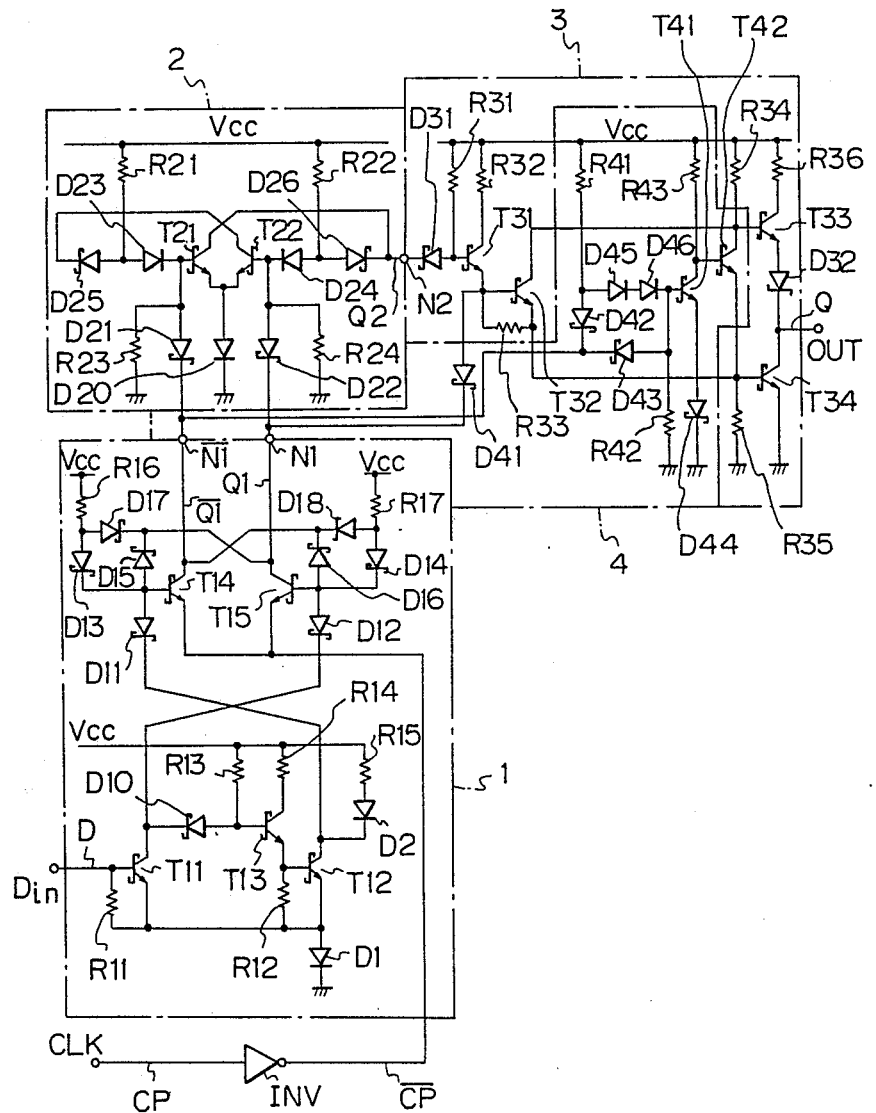
FIG. 4 is a circuit diagram illustrating an embodiment of the present invention.

Next, a concrete circuit constitution of the arrangement in FIG. 3 will be described with reference to FIG. 4. FIG. 4 illustrates a circuit constitution of the D-F.F. arrangement as an embodiment of the present invention.

The D-F.F. arrangement illustrated in FIG. 4 possesses a form integrated on a semiconductor substrate and, besides the master F.F. 1, slave F.F. 2, output buffer 3 and drive circuit 4, includes an inverter INV effecting a buffering of a clock signal CP of TTL level received at a clock input terminal CLK and feeding an inverted clock $\overline{\text{CP}}$ to the master F.F. 1. Note, in the description below, a term "transistor" indicates an NPN Schottky diode clamp type transistor and a term "diode" indicates a Schottky barrier diode, so far as a special definition is not added thereto.

First, referring to the master F.F. 1, the input terminal $D_{in}$ for the data D is connected to one end of a resistor R11 and a base of a transistor T11. Other end of the resistor R11 and an emitter of the transistor T11 are connected via a resistor R12 to a base of a transistor T12 and connected to an emitter of the transistor T12, and grounded via a forward-connected ordinary diode D1. A collector of the transistor T11 is connected to a cathode of a diode D10, an anode of which is connected via a resistor R13 to a power supply line $V_{CC}$ and connected to a base of a transistor T13. An emitter of the transistor T13 is connected to the base of the transistor T12 and a collector thereof is connected via a resistor R14 to the power supply line $V_{CC}$. A collector of the transistor T12 is connected via a backward-connected ordinary diode D2 and a resistor R15 to the power supply line $V_{CC}$.

Also, the collector of the transistor T12 is connected via a backward-connected diode D11 a base of a transistor T14, and the collector of the transistor T11 is connected via a backward-connected diode D12 to a base of a transistor T15. Both of emitters of the transistors T14 and T15 are connected to the output end of the inverter INV. The base of the transistor T14 (T15) is connected via a backward-connected diode D13 (D14) to one end of a resistor R16 (R17) and an anode of a diode D17 (D18) and connected via a forward-connected diode D15 (D16) to a cathode of the diode D17 (D18) and a collector of the transistor T15 (T14). Other end of the resistor R16 (R17) is connected to the power supply line $V_{CC}$.

Next, referring to the slave F.F. 2, both of emitters of transistors T21 and T22 are grounded via a forward-connected ordinary diode D20. A base of the transistor T21 (T22) is connected via a forward-connected diode D21 (D22) to the output end N1 ($\overline{N1}$) of the master F.F. 1. Also, the base of the transistor T21 (T22) is grounded via a resistor R23 (R24), connected via a backward-connected ordinary diode D23 (D24) to an anode of a diode D25 (D26), and connected via the diode D23 (D24) and a resistor R21 (R22) to the power supply line $V_{CC}$. A cathode of the diode D25 (D26) is connected to a collector of the transistor T22 (T21).

Next, referring to the output buffer 3, a cathode of a diode D31 is connected to the output end of the slave F.F. 2, i.e., a node N2, and an anode thereof is connected via a resistor R31 to the power supply line $V_{CC}$ and connected to a base of a transistor T31. A collector of the transistor T31 is connected via a resistor R32 to the power supply line $V_{CC}$, and an emitter thereof is connected to a base of a transistor T32 and connected via a resistor R33 to an emitter of the transistor T32. A collector of the transistor T32 is connected via a resistor R34 to the power supply line $V_{CC}$ and connected to a base of a transistor T33, and the emitter thereof is connected to a base of a transistor T34 and grounded via a resistor R35. A collector of the transistor T33 is connected via a resistor R36 to the power supply line $V_{CC}$, and an emitter thereof is connected via a forward-connected diode D32 to the output terminal OUT. A collector of the transistor T34 is connected to the output terminal OUT, and an emitter thereof is grounded.

Finally, referring to the drive circuit 4, a cathode of a diode D41 is connected to the node N1 of the master F.F. 1, and an anode thereof is connected to the emitter of the transistor T31 and the base of the transistor T32. Both of cathodes of diodes D42 and D43 are connected to the node N1 of the master F.F. 1, and an anode of the diode D42 is connected via a resistor R41 to the power supply line $V_{CC}$ and connected to an anode of an ordinary diode D45. A diode D46 is connected in series with the diode D45 in the forward direction, and a cathode thereof is connected to a base of a transistor T41 and an anode of the diode D43 and grounded via a resistor R42. An emitter of the transistor T41 is grounded via a forward-connected diode D44, and a collector thereof is connected to a base of a transistor T42 and connected via a resistor R43 to the power supply line $V_{CC}$. An emitter of the transistor T42 is connected to the base of the transistor T34, and a collector thereof is connected to the base of the transistor T33. The transistors T41 and T42 correspond to the switching means 4A shown in FIG. 3.

Next, the operation of the arrangement shown in FIG. 4 will be explained with reference to the waveform diagrams shown in FIGS. 5a to 5h.

Initially, assuming that the data D is at "H" level. When the clock CP is at "L" level, both of emitters of transistors T14 and T15 are brought to "H" level via the inverter INV. Thus, since the transistors T14 and T15 keep their OFF states, the master F.F. 1 cannot carry out its flip-flop operation. Accordingly, outputs Q1 and $\overline{Q1}$ of the master F.F.1 are maintained at "H" level, as shown in FIGS. 5d and 5e. When the clock CP is changed to "H" level, the emitters of the transistors T14 and T15 are brought to "L" level with the constant delay time $T_d$ (INV). Accordingly, in this state, the master F.F. 1 can carry out its flipflop operation in accordance with potentials appearing at bases of the transistors T14 and T15, i.e., the logical level of the data D.

In this case, since the data D is at "H" level, the transistor T11 is turned ON and, accordingly, currents flow from the power supply line $V_{CC}$ via the resistor R13, the diode D10, the transistor T11 and the diode D1 to the ground. As a result, the transistor T13 is turned OFF by the decrease in its base potential, and the transistor T12 is also turned OFF by the decrease in its base potential. Since the base of the transistor T14 is supplied with currents by the power supply line $V_{CC}$ via the resistor R16 and the diode D13, the transistor T14 is turned ON. On the other hand, the base potential of the transistor T15 is lowered to approximately zero level, because currents flow from the power supply line $V_{CC}$ via the resistor R17, the diodes D14 and D12, the transistor T11 and the diode D1 to the ground. As a result, the transistor T15 is turned OFF. The transistors T14 and T15 carry out the flip-flop operation, so that data Q1 appearing at the node N1 is maintained at "H" level and data $\overline{Q1}$ at the node $\overline{N1}$ is lowered to "L" level.

Inversely, when the data D is at "L" level while the clock CP is at "H" level, the data Q1 at the node N1 is lowered to "L" level.

Next, the operation of the drive circuit 4 will be explained in contrast to the prior art.

First, assuming that the drive circuit 4 is not provided (see FIGS. 2d to 2g).

When the potential Q1 ($\overline{Q1}$) at the node N1 ($\overline{N1}$) is changed from "H" level to "L" level, the base current of the transistor T22 (T21) is pulled out to the master F.F. side by the diode D22 (D21), so that the transistor T22 (T21) is turned OFF. As a result, the currents are fed from the power supply line $V_{CC}$ via the resistor R21 (R22) and the diode D23 (D24) to the base of the transistor T21 (T22), so that the transistor T21 (T22) is turned ON. The potential Q2 at the node N2 is settled to "L" ("H") level by the flip-flop operation of the transistors T21 and T22, but with the constant delay time $T_d$ (S) after the change in logical levels of the potentials Q1 and $\overline{Q1}$.

When the potential Q2 at the node N2 is changed to "H" level, the transistor T31 is supplied with its base current by the power supply line $V_{CC}$ via the resistor R31 and, accordingly, it is turned ON. Thus, the transistors T32 and T34 are brought to the ON state and the transistor T33 is brought to the OFF state. As a result, the logical output Q at the output terminal OUT is pulled down to "L" level, but with the constant delay time $T_d$ (OUT) after the change in logical level of the potential Q2.

Therefore, where the drive circuit 4 is not provided, the propagation delay time, indicated by reference $T_1$, required from when the outputs Q1 and Q1 of the master F.F. 1 are changed in level until when the logical output Q is settled in logical level is indicated by the sum of the delay time $T_d(S)$ due to the flip-flop operation of the slave F.F. 2 and the delay time $T_d$(OUT) due to the buffering operation of the output buffer 3a. Namely, $$T_1 = T_d(S) + T_d(\text{OUT})$$

Next, assuming that the drive circuit 4 is provided (See FIGS. 5d to 5h).

When the potential Q1 at the node N1 is changed from "H" level to "L" level, in the drive circuit 4, the currents flow from the power supply line $V_{CC}$ via the resistor R41 and the diode D42 into the node N1. As a result, the currents fed via the diodes D45 and D46 to the base of the transistor T41 are broken off and, accordingly, the transistor T41 is turned OFF. Thus, since the transistor T42 is supplied with its base current by the power supply line $V_{CC}$ via the resistor R43, it is turned ON.

The switching of the transistor T41 to the OFF state and that of the transistor T42 to the ON state are completed with a constant delay time $T_d$ (D) after the change in logical level of the potential Q1 or Q1.

When the transistor T42 is turned ON, the base potential of the transistor T33 is lowered resulting in the OFF state of the transistor T33, while the base potential of the transistor T34 is raised. In the state, since the potential Q1 at the node N1 is at "H" level, the base potential of the transistor T34 is maintained at "H" level. Therefore, the transistor T34 is turned ON and, accordingly, the logical output Q is pulled down to "L" level. In this case, the change of the logical output Q to "L" level is completed with a constant delay time $T_d$ (OUT') after the switching of the transistors T41 and T42.

Therefore, where the drive circuit 4 is provided, the propagation delay time, indicated by reference $T_2$, required from when the outputs Q1 and Q1 of the master F.F. 1 are changed in level until when the logical output Q is settled in logical level is indicated by the sum of the delay time $T_d$(D) due to the switching operation of the drive circuit 4 and the delay time $T_d$ (OUT') due to the buffering operation of the output buffer 3. Namely, $$T_2 = T_d(D) + T_d(\text{OUT'})$$

In this case, the delay time $T_d$ (D) is defined by the time necessary for the switching of the transistors T41 and T42 and extremely short. Contrary to this, the delay time $T_d(S)$ in the aforementioned slave F.F. 2 is defined by the time necessary for the ON/OFF operation of the transistors T21 and T22, which is dependent on the pull-up operation of the resistors R21 and R22. Therefore, the delay time $T_d$ (D) is much shorter than the delay time $T_d$ (S). Namely, since the propagation delay time $T_2$ is shorter than the propagation delay time $T_1$, the total propagation delay time $T_{d2}$ can be reduced compared with the prior art ($T_{d1}$).

As explained above, according to the constitution of the present example, the output buffer 3 is directly driven by the drive circuit 4 responding to the data Q1 and Q1 output from the master F.F. 1 and determines the logical output Q. Accordingly, although the delay time $T_d$ (D) occurs in the drive circuit 4, the propagation delay time $T_d(S)$ of data occurring in the slave F.F. 2, which is longer than the time $T_d$ (D), does not give any influence on the total propagation delay time of the arrangement. Namely, since the delay time $T_d(S)$ in the slave F.F. 2 is thoroughly disregarded, the total propagation delay time can be greatly reduced in comparison with the prior art constitution (see FIG. 1).

Also, since the time required for switching of data in the slave F.F. 2 does not give any influence on the total delay time of the arrangement, it is possible to increase the values of the resistors R21 and R22 in the slave F.F. 2. By increasing the resistances, the currents flowing in the slave F.F. 2 are decreased in quantity. This leads to the decrease in the power dissipation and is very preferable.

Although the present invention has been disclosed and described by way of only one embodiment, it is apparent to those skilled in the art that other embodiments and modifications of the present invention are possible without departing from the spirit or essential features thereof.

I claim:

1. A flip-flop arrangement receiving a clock signal and an input data and outputting a logical output in accordance with a logical level of said input data, said flip-flop arrangement comprising:

a master flip-flop for transmitting a pair of output signals having a complementary level corresponding to said logical level of said input data to a pair of output ends when said clock signal is at a first logical level and transmitting a pair of output signals having an in-phase and predetermined level to said pair of output ends regardless of said logical level of said input data when said clock signal is at a second logical level;

a slave flip-flop connected to said master flip-flop and receiving said pair of output signals having a complementary level transmitted to said pair of output ends, said slave flip-flop latching data corresponding to said pair of output signals when said clock signal is brought to said second logical level and outputting an output signal having a level corresponding to said data to an output end thereof;

an output buffer connected to said output end of the slave flip-flop, for effecting a buffering of said data latched in said slave flip-flop, said output buffer including a first power supply line, a second power supply line having a lower voltage than said first power supply line, a first transistor having a base connected to said output end of the slave flip-flop and a collector connected to a side of said first power supply line, a second transistor having a base connected to an emitter of said first transistor, a third transistor having an emitter connected to a side of an output terminal, a collector connected to a side of said first power supply line, and a base connected to a collector of said second transistor, and a fourth transistor having a collector connected to a side of said output terminal, an emitter connected to a side of said second power supply line, and a base connected to an emitter of said second transistor; and a drive circuit connected between said master flip-flop and said output buffer, for driving said output buffer to output said logical output in response to logical levels of data appearing at said pair of output ends of said master flip-flop, said drive circuit including a first diode having an anode connected to a base of said second transistor and a cathode connected to one of said pair of output ends of the master flip-flop, a fifth transistor having a collector connected to said collector of the second transistor, and an emitter connected to said emitter of the second transistor, a sixth transistor having a collector connected to a base of said fifth transistor and an emitter connected to a side of said second power supply line, and a second diode having an anode connected to a side of a base of said sixth transistor and a cathode connected to another of said pair of output ends.

* * * * *